US011436078B2

United States Patent
Singidi et al.

(10) Patent No.: US 11,436,078 B2
(45) Date of Patent: Sep. 6, 2022

(54) NAND PARITY INFORMATION TECHNIQUES FOR SYSTEMS WITH LIMITED RAM

(71) Applicant: Micron Technology, Inc., Boise, ID (US)

(72) Inventors: Harish Reddy Singidi, Fremont, CA (US); Xiangang Luo, Fremont, CA (US); Jianmin Huang, San Carlos, CA (US); Kishore Kumar Muchherla, Fremont, CA (US); Ashutosh Malshe, Fremont, CA (US); Vamsi Pavan Rayaprolu, San Jose, CA (US); Sampath Ratnam, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/228,425

(22) Filed: Apr. 12, 2021

(65) Prior Publication Data
US 2021/0303394 A1    Sep. 30, 2021

Related U.S. Application Data

(63) Continuation of application No. 16/159,027, filed on Oct. 12, 2018, now Pat. No. 10,977,115.

(51) Int. Cl.
*G06F 11/10*    (2006.01)
*G11C 7/10*     (2006.01)
(Continued)

(52) U.S. Cl.
CPC ...... *G06F 11/1064* (2013.01); *G06F 11/1068* (2013.01); *G06F 12/0246* (2013.01);
(Continued)

(58) Field of Classification Search
CPC ............ G06F 11/1064; G06F 11/1068; G06F 12/0246; G06F 2212/7203; G06F 3/0619;
(Continued)

(56) References Cited

U.S. PATENT DOCUMENTS 10,977,115 B2    4/2021  Singidi et al.
2009/0265578 A1* 10/2009 Baloun ............... G06F 11/1076
                                                            714/6.12

(Continued)

OTHER PUBLICATIONS

"Chinese Application Serial No. 201910955412.3, Voluntary Amendment Filed Aug. 11, 2020", w/ English Claims, 21 pgs.

*Primary Examiner* — Thien Nguyen
(74) *Attorney, Agent, or Firm* — Schwegman Lundberg & Woessner, P.A.

(57) ABSTRACT

Disclosed in some examples are techniques for handling parity data of a non-volatile memory device with limited cache memory. In certain examples, user data can be programmed into the non-volatile memory of the non-volatile memory device in data stripes, and parity information can be calculated for each individual data stripe within a limited capacity cache of the non-volatile memory device. The individual parity information can be swapped between a swap block of the non-volatile memory and the limited capacity cache as additional data stripes are programmed.

20 Claims, 8 Drawing Sheets

(51) Int. Cl.
*G11C 11/419* (2006.01)
*G06F 12/02* (2006.01)

(52) U.S. Cl.
CPC .......... *G11C 7/1006* (2013.01); *G11C 7/1057* (2013.01); *G11C 11/419* (2013.01); *G06F 2212/7203* (2013.01)

(58) Field of Classification Search
CPC ...... G06F 3/064; G06F 3/0679; G06F 11/108; G06F 2212/1016; G06F 2212/1044; G06F 2212/7208; G11C 7/1006; G11C 7/1057; G11C 11/419; G11C 16/0483; G11C 11/5628; G11C 29/42
See application file for complete search history.

(56) References Cited

U.S. PATENT DOCUMENTS

| | | | |
|---|---|---|---|
| 2011/0231724 A1* | 9/2011 | Hara | G06F 11/1068 714/746 |
| 2011/0271039 A1* | 11/2011 | Baek | G06F 12/0246 711/103 |
| 2012/0166910 A1 | 6/2012 | Baek et al. | |
| 2012/0278531 A1* | 11/2012 | Horn | G06F 11/108 711/103 |
| 2015/0178155 A1* | 6/2015 | Kim | G11C 11/419 714/758 |
| 2020/0117538 A1 | 4/2020 | Singidi et al. | |

* cited by examiner

FIG. 5

NAND PARITY INFORMATION TECHNIQUES FOR SYSTEMS WITH LIMITED RAM

PRIORITY APPLICATION

This application is a continuation of U.S. application Ser. No. 16/159,027, filed Oct. 12, 2018, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 illustrates generally an example data and parity information placement scheme according to an example of the present subject matter.

DETAILED DESCRIPTION

Disclosed in some examples are techniques of organizing data written to a memory device (such as a NAND memory device) of a mobile device in order to protect against certain types of faults. For example, mobile devices typically do not include a large amount of RAM that can be dedicated to maintaining parity information as a memory device is programmed. Consequently, the present disclosure addresses example techniques of maintaining data stripe parity information through use of a swap area of the NAND memory in cooperation with a small RAM buffer. Such techniques balance mobile device performance with minimal RAM utilization to provide robust techniques to allow recovery of data should errors occur during data programming of the NAND memory device.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), static RAM (SRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 1:
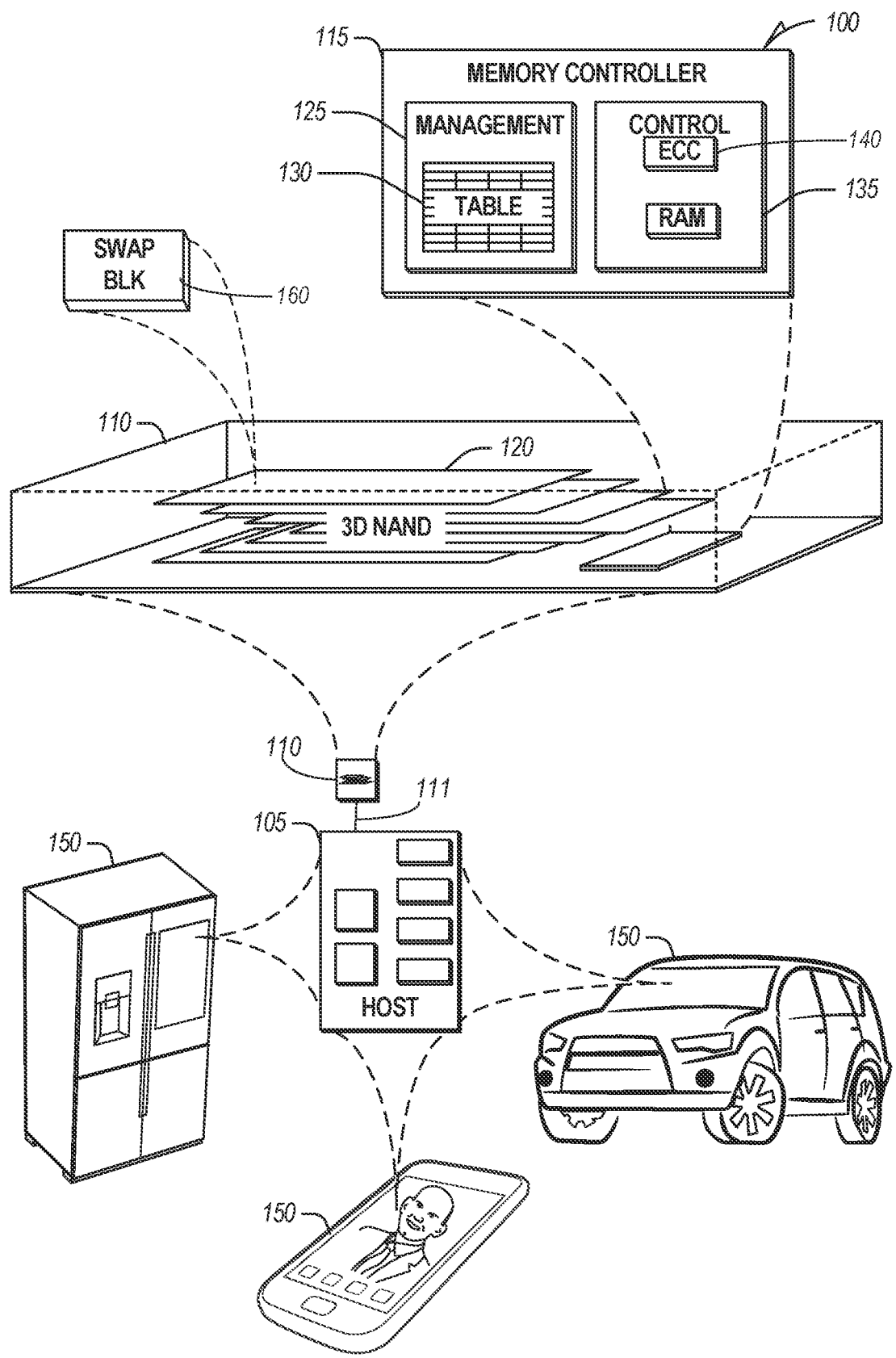
FIG. 1 illustrates an example of an environment including a memory device.

FIG. 1 illustrates an example of an environment 100 including a host 105 and a memory device 110 configured to communicate over a communication interface 111. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces 111 can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 1700 of FIG. 17.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array may comprise a number of NAND dies and one or more functions of the memory controller 115 for a particular NAND die may be implemented on an on-die controller on that particular die. Other organizations and delineations of control functionality may also be utilized, such as a controller for each die, plane, superblock, block, page, and the like.

The memory array 120 can include several memory cells arranged in, for example, a number of devices, semi-conductor dies, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

In certain examples, the memory array 120 can include non-volatile memory for storing user data. The non-volatile memory can include a swap block 160 for handling parity information associated with user data when the non-volatile memory is being programmed. The parity data can, in association with a small volatile buffer of the memory controller or other component of the NAND memory device, assist in recovering user data lost or corrupted during programming of the non-volatile memory.

Figure 2:
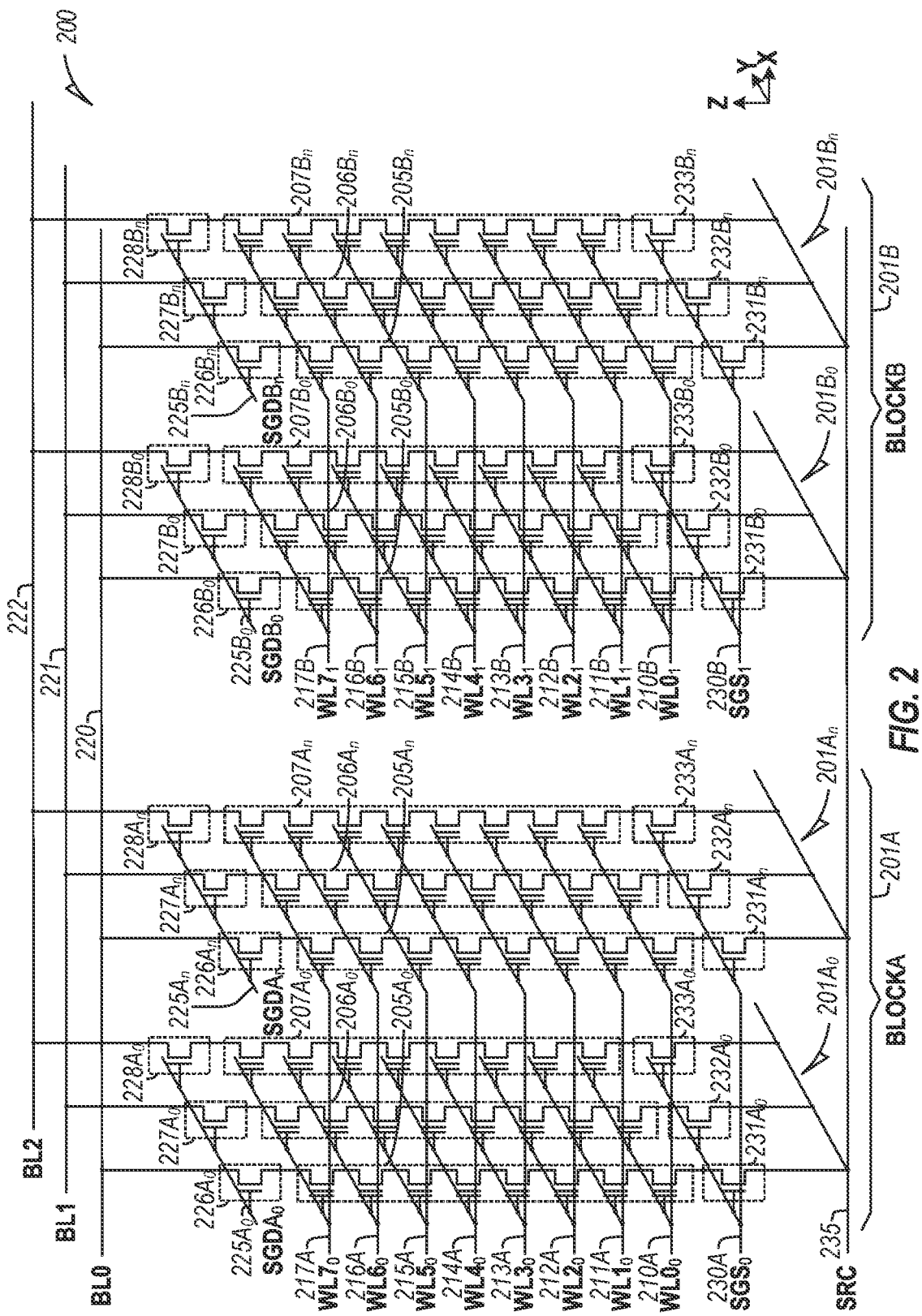
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-

228$B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ 225$A_0$, first-third $A_n$ SGD $226A_n$-$228A_n$ can be accessed using an $A_n$ SGD line $SGDA_n$ 225$A_n$, first-third $B_0$ SGD $226B_0$-$228B_0$ can be accessed using an $B_0$ SGD line $SGDB_0$ 225$B_0$, and first-third $B_n$ SGD $226B_n$-$228B_n$ can be accessed using an $B_n$ SGD line $SGDB_n$ 225B. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
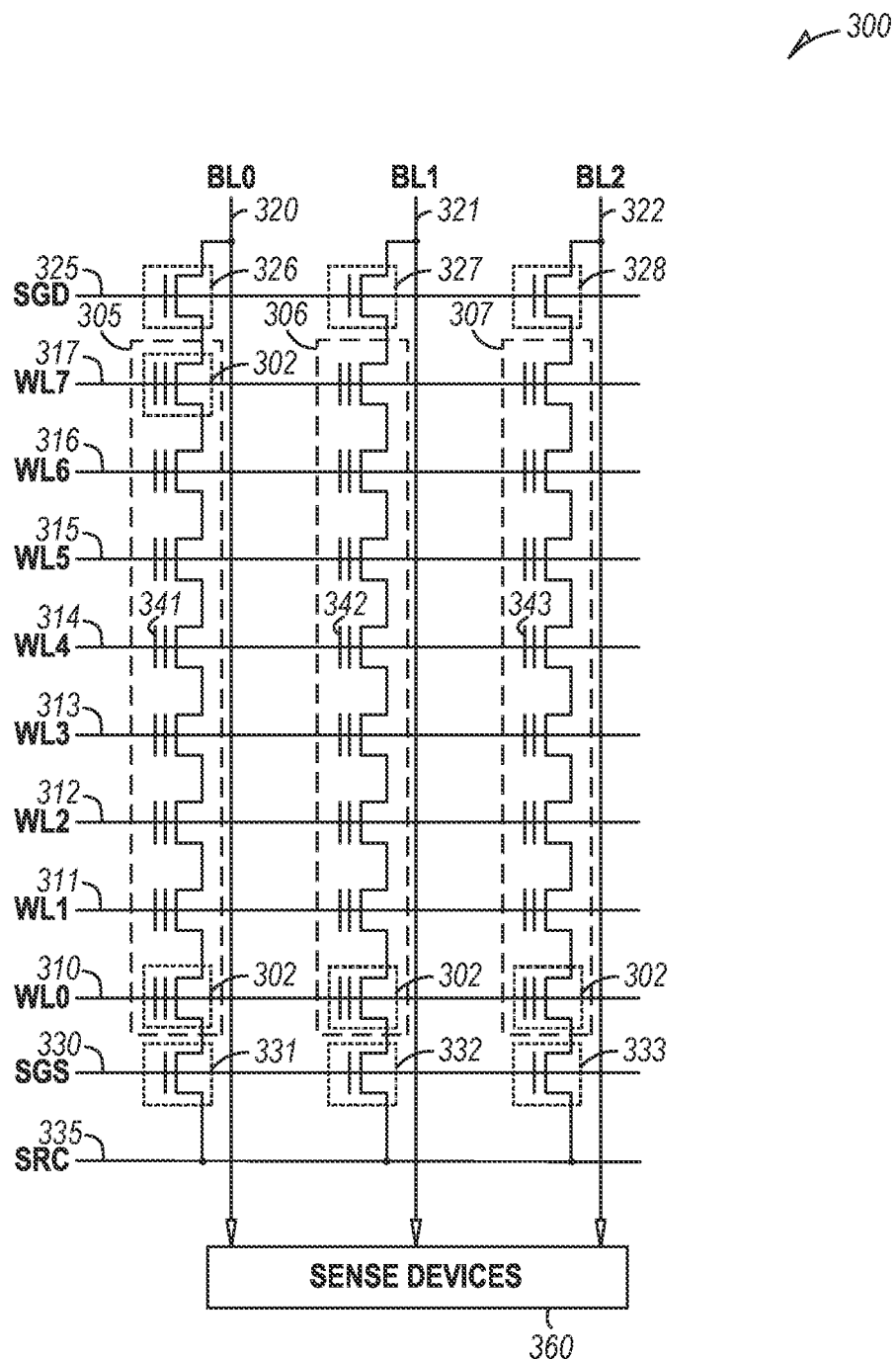

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
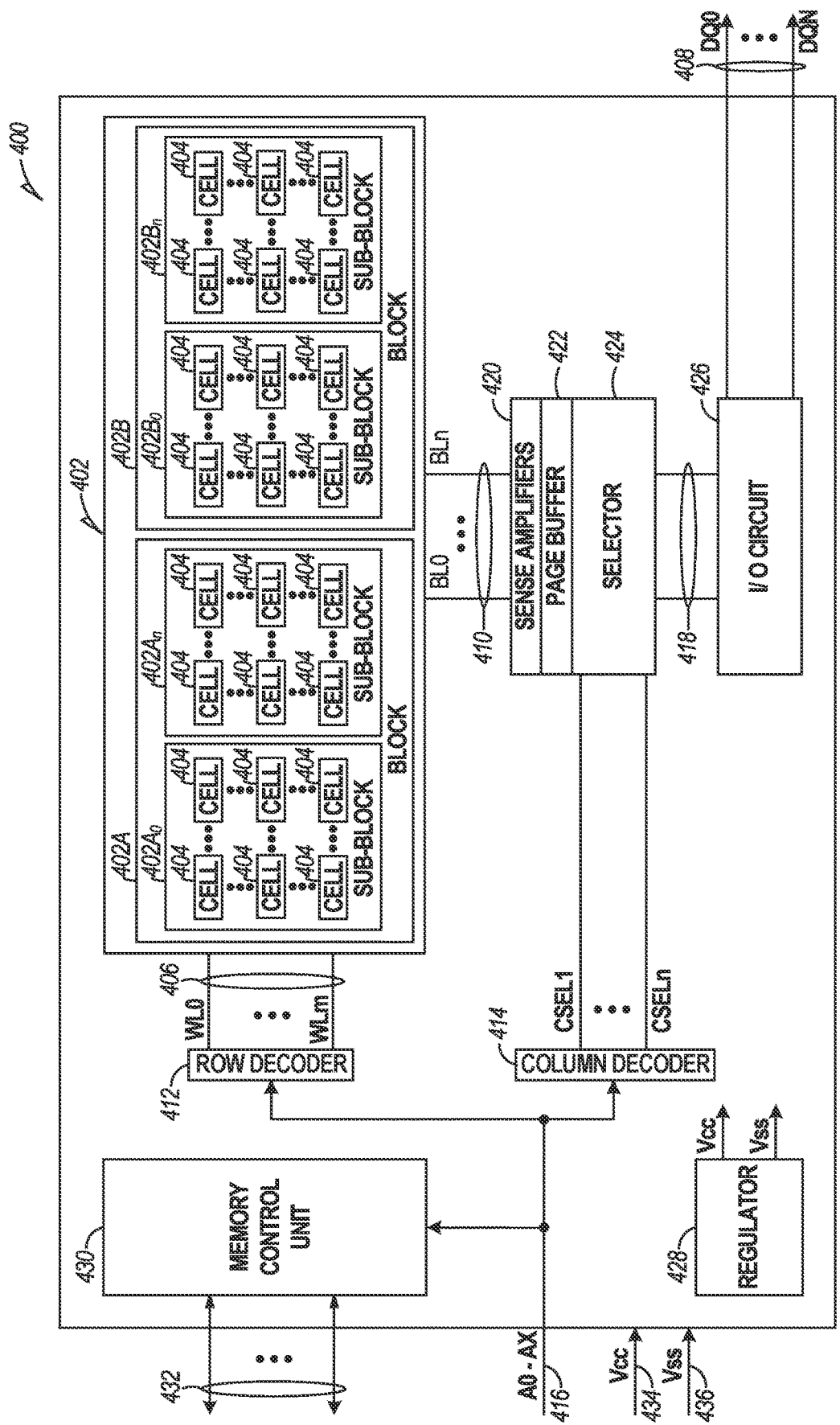
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

As used herein, a page line is a logical construct that identifies a group of pages comprising pages at a same position in each plane in a group of planes. Thus, for example, the first page in planes 0-3 is identified by page line 0. A page is made up of memory cells belonging to the same word line (WL). A block is a group of pages—i.e., all NAND strings that share the same group of word lines (a NAND string is a group of NAND cells connected in series). In some NAND configurations, a block is a smallest erasable unit. A page is a smallest addressable unit for reading and writing. A plane is a group of physical blocks on a single NAND die, configured for operation such that physical blocks from each of multiple planes can be erased in parallel (i.e., during a given time interval the physical blocks can be erased essentially simultaneously, or in overlap with one another), but only a single physical block in any individual plane can be erased at any one time. There may be multiple planes per NAND die.

ECC and other techniques have increased the reliability of NAND devices substantially. Nonetheless, there are certain circumstances in which additional protection against data loss is desired. A data stripe can include (e.g., be a combination of) user data and parity data. The parity data of the data stripe can include error protection data that can be used to protect user data stored in the memory against defects and/or errors that may occur during operation of the memory. For example, the parity information of a data stripe can protect user data stored in memory against defects and/or errors that may occur during operation of the memory, and can therefore provide protection against a failure of the memory. Defects and/or errors the parity information can provide protection against include electrical shorts that may occur between different components of the memory, and/or shorts that may occur at the interface between groups of memory and the respective driver associated therewith.

Disclosed in some examples are techniques to allow parity information storage and manipulation in a very limited amount of random access memory (RAM), as may be found, for example, in a mobile device. In some examples, parity information may be calculated and stored until the programming is finished. In some examples, due to the lack of RAM, the parity information is swapped between RAM of the memory device and non-volatile memory of the memory device until programming is complete. This parity information may be utilized to recover from corruption of a portion of the data stripe as discussed above.

Figure 5:
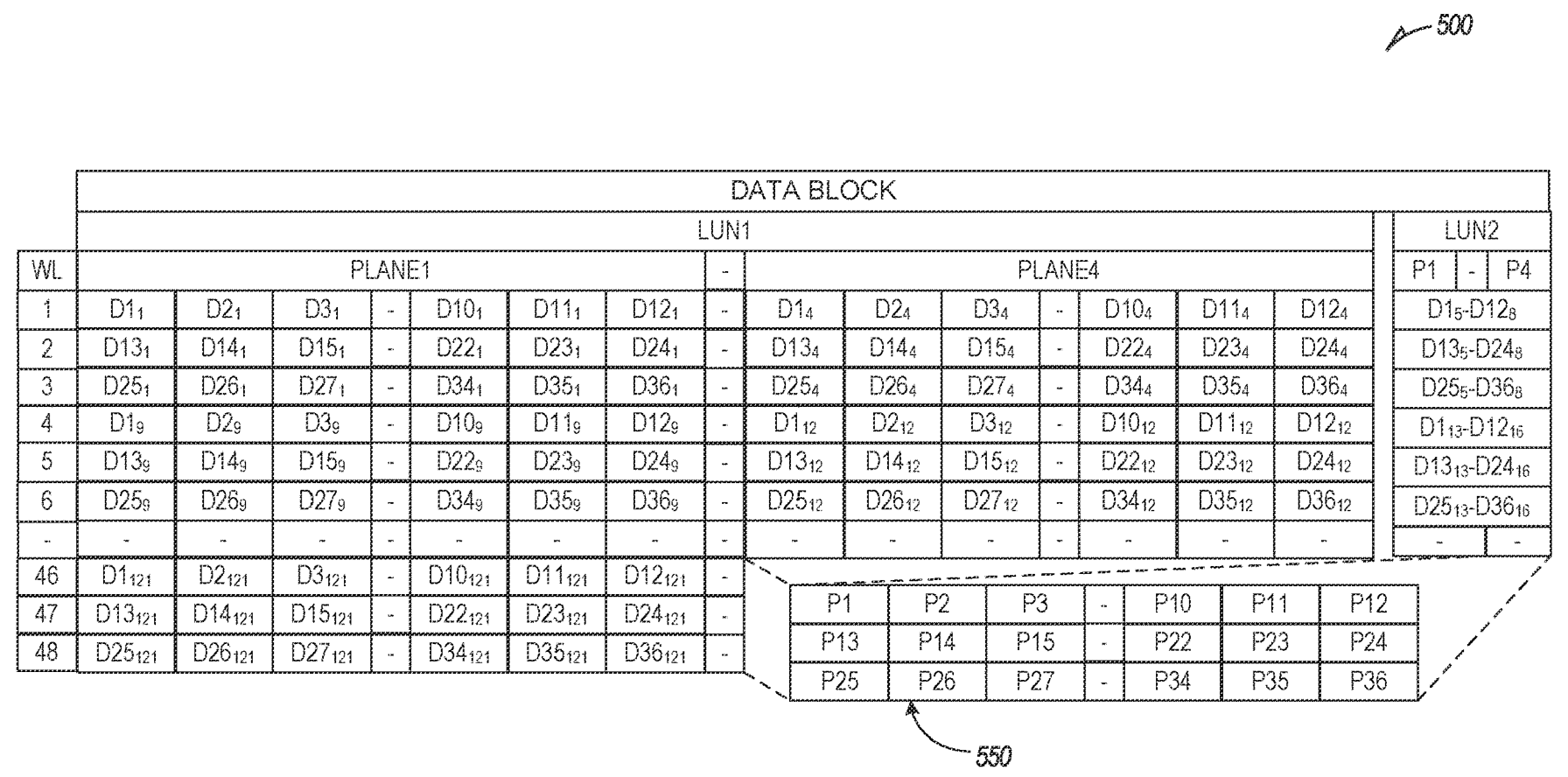

FIG. 5 illustrates generally an example data and parity information placement scheme within a data block of memory according to an example of the present subject matter. The placement scheme shows a non-volatile memory device 500 that provides 12 pages per word line (WL) and 4 planes per logical unit (LUN). The example is based on having 3 WLs of separation between data of a common data stripe. The WL separation criteria along with the 12 pages per WL layout sets forth that the data be stored on at least 36 data stripes. Assuming at least 128 pages are available for each data stripe, (127 pages for user data and 1 page for parity of the stripe), 16 different WLs can be assigned to each data stripe if 2 LUNs are used. In certain examples, once the programming of all the data stripes is closed, the parity information can be stored within a location 550 of the data block.

If programming pages out of sequence is not allowed, data stripe 1 (D1) cannot be closed until the 540th page, associate with WL46, is programmed. Thus, during programming, data parity information for each of the 36 data stripes can be stored and updated in a memory block separate from the data block. Conventional schemes use RAM space to store and update data stripe parity as the data block is programmed. In certain examples, such as for mobile electronic devices, only a limited number of pages of RAM space is allocated for parity information manipulation while programming and may not be sized to hold all the in-programming parity information.

In certain examples of the present subject matter, a dedicated swap block of non-volatile memory can be used as a parity information area or placeholder until a data stripe can be closed. The swap block can be allocated a a separate block of memory separate from the data block.

Figures 6A, 6B:
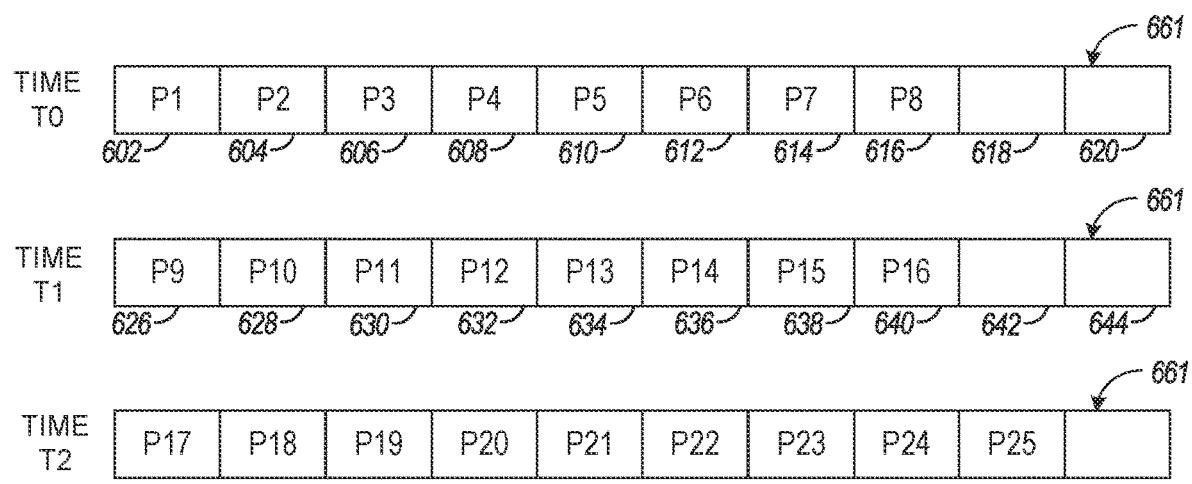
FIG. 6A illustrates generally an example swap block.
FIG. 6B illustrates a logical placement of the parity pages in volatile memory of the memory controller or other component of the NAND according to some examples of the present disclosure.

FIG. 6A illustrates generally an example swap block 660. FIG. 6B illustrates a logical time-wise placement of parity pages in volatile memory, or RAM buffer 651, of the memory controller or other component of the NAND according to some examples of the present disclosure. If pages of user data within the data block of memory are not allowed to be programmed out of sequence and a data placement scheme does not allow pages of user data to be stored in immediately sequential pages, data stripe parity information can be repeatedly swapped between the RAM buffer 651 and the swap block 660.

In certain examples, whenever the memory controller writes data to new pages belonging to an open data stripe, the parity information of at least that data stripe can be read from the parity swap block 660 to the RAM buffer 651, and new parity information can be determined or calculated. In some examples, a logical function such XOR can be used to generate new parity information for an open data stripe. If new data is written to a second data stripe not associated with the parity information in the RAM buffer 651, the parity information in the RAM buffer can be copied to the parity swap block 660 and parity information associated with at least the second data stripe can be read from the parity swap block 660 to the RAM buffer 651, and so on until all the data stripes are closed. In certain examples, as a data stripe is closed, the parity information in the parity swap block 660 associated with the closed data stripe can be discarded. In some examples, the swap block information is discarded when all the data stripes are closed.

The example data placement in non-volatile memory of a memory device as illustrated in FIG. 5 is just one example of data placement and it is understood that other data placement schemes are possible without departing from the scope of the present subject matter. In certain examples, the nonvolatile memory device 500 may receive a first data item from a host device. This first data item may be split into a number of portions. For purposes of the present description, an example will be utilized in which a received data item is split into 127 portions. It is understood that received data items may be split into a fewer number of portions or a greater number of portions without departing from the scope of the present subject matter. A first portion of the first data item, which can also be referred to as a first portion of a first data stripe ($D1_1$), may be programmed at a first location within a first data stripe (D1) in the NAND, a second portion ($D1_2$) at a second location, a third portion ($D1_3$) at a third location, and so on. Each portion of user data is noted as $DN_M$, where N is a positive integer value denoting the data item or data stripe within the NAND memory, and M is a positive integer value denoting the data item or data stripe portion. The locations of each data stripe portion may be selected based on a particular data placement scheme.

The example placement scheme of FIG. 5 places portions of the first data item or data strip (D1), as well as, portions of other data items, such that each sequential portion of the first stripe are stored in memory cells that are on different planes with respect to each other but may be on the same WL. If a portion of the first data stripe is on WLi, where i is an integer value, no word line within the WL separation of WLi can be associated with any other portion of the first data stripe. With regard to the example of FIG. 5, multiple portions of the first data stripe (D1) are on WL4. No other portions of the first data stripe (D1) are located on the two WLs (WL2, WL3, WL5, WL6) immediately adjacent to WL4. Thus, the data placement scheme has 3 WL separation that can be helpful for some data loss scenarios such as WL shorts. In certain examples, the non-volatile memory device 500 can include a parity location 550 for storing parity information for each data stripe once programming is complete. In the present example, the parity location 550 can occupy 36 pages corresponding to the 36 data stripes allocated to save user data. Depending on the number of portions of each data stripe, the WL separation, and the configuration of the non-volatile memory system, the number of data stripes can be larger or smaller and the swap block 660 may use more or less pages to store the data stripe parity information when the non-volatile memory system is being programmed.

A parity page may be calculated from the data stripe portions for each data stripe. For example, for a data stripe having only four portions, the parity page may be an XOR of the data in the first portion, the second portion, the third portion, and the fourth portion. For example:

$$PN=DN_1 \oplus DN_2 \oplus DN_3 \oplus DN_4$$

where $\oplus$ is an XOR operator.

The parity information may be calculated and temporarily stored in volatile memory (e.g., RAM) and then swapped periodically into non-volatile storage in a separate NAND memory block, the parity swap block 660, as shown in FIG. 6. In certain examples, the swap block 660 location can be either a SLC, MLC, TLC, or QLC block. In certain examples, SLC blocks can provide faster read and write operations and can also be beneficial as the endurance capability of an SLC block can be significantly higher than the other forms of blocks (e.g., MLC, TLC, QLC). In certain examples, the swap block 660 does not result in garbage collection because once a data stripe is closed, the parity information in the swap block 660 is invalid.

FIG. 6B illustrates a logical placement of the parity pages in volatile memory of the memory controller or other component of the NAND according to some examples of the present disclosure. The parity pages shown in FIG. 5 are parity pages that are calculated for the data stripes (DN) in FIG. 5 once all the data stripes are closed. As the data stripes are programmed to the NAND in FIG. 5, the parity information can be calculated and stored in volatile memory (e.g., Random Access Memory (RAM) 651). At a first time, T0, the portions of data stripes D1-D8 can be written to WL1 and planes 0-3 of LUN1. At the same time, the parity information of these data stripes: 602-620 can be calculated and stored in volatile storage such as RAM buffer 661, as shown in FIG. 6B.

At time T1, the portions of data stripes D9-D16 can written to WL1 and the corresponding parities (P9-P16) can be calculated in RAM 651, as shown in FIG. 6. In some examples, the parity information 602-620 can be overwritten with the parity information 626-644. In some examples, the parity information 602-620 may be written to the NAND swap block 660 before they are overwritten, for example, to a reliable SLC block. Similarly, at time T2 parity information for data stripes D17-D25 can be calculated and swapped with existing values in the parity swap block 660. The parity information stored in RAM 661 of the memory device or in the swap block 660 may be used to recover user data lost or corrupted during programming operations of the non-volatile memory of the memory device.

Figure 7:
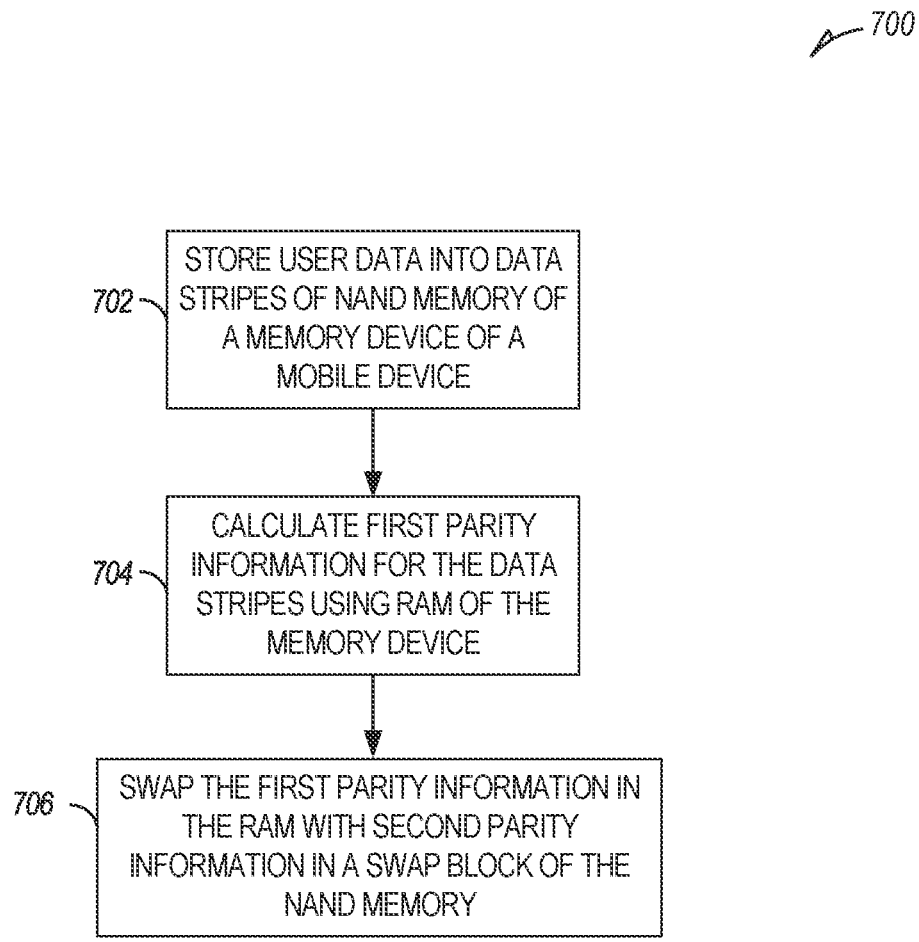
FIG. 7 shows a flowchart of an example method 700 of using a non-volatile swap block to assist in maintaining parity information of a plurality of data stripes when the aggregate parity information for open data stripes is larger than the cache or RAM available on the memory device.

FIG. 7 shows a flowchart of an example method 700 of using a non-volatile swap block to assist in maintaining parity information of a plurality of data stripes when the aggregate parity information for open data stripes is larger than the cache or RAM available on the memory device. At 702, a memory controller of a non-volatile memory device can store or program user data into NAND memory of the non-volatile memory device. At 704, as user data is stored in data stripes within the NAND memory, a cache or RAM memory of the memory device, or of the memory controller of the memory device, can be used to update or calculate first parity information of the user data. When new user data is ready to be stored or programmed into different data stripes, the first parity information in the cache of the memory device can be swapped with second parity information in a swap block of the NAND memory. Swapping the parity information allows the first parity information to be saved in the NAND memory and the second parity information available for updating as the new user data is programmed into different data stripes than the first user data. Using the parity swap block can allow a memory device with limited RAM to provide parity information for a plurality of data stripes independent of the word line separation of the data placement scheme of the memory device and independent of the number of open data stripes.

Figure 8:
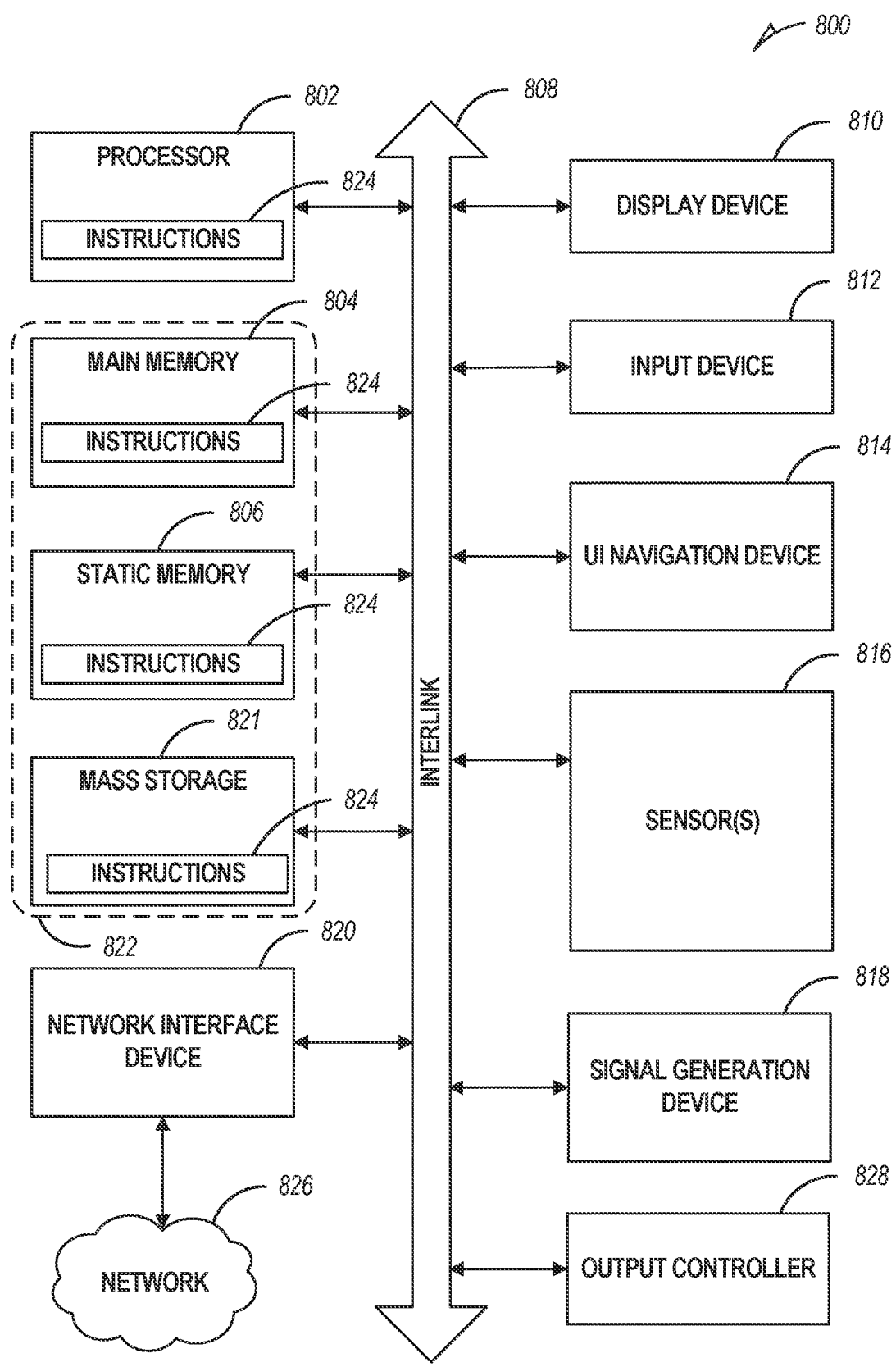
FIG. 8 illustrates a block diagram of an example machine 800 upon which any one or more of the techniques (e.g., methodologies) discussed herein may perform.

FIG. 8 illustrates a block diagram of an example machine 800 upon which any one or more of the techniques (e.g., methodologies) discussed herein may perform. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 800 (e.g., the host device 105, the memory device 110, etc.) may include a hardware processor 802 (e.g., a central processing unit (CPU), a graphics processing unit (GPU), a hardware processor core, or any combination thereof, such as the memory controller 115, etc.), a main memory 804 and a static memory 806, some or all of which may communicate with each other via an interlink (e.g., bus) 808. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 816, a signal generation device 818 (e.g., a speaker), a network interface device 820, and one or more sensors 816, such as a global positioning system (GPS) sensor, compass, accelerometer, or other sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 may constitute the machine readable medium 822.

While the machine readable medium 822 is illustrated as a single medium, the term "machine readable medium" may include a single medium or multiple media (e.g., a centralized or distributed database, or associated caches and servers) configured to store the one or more instructions 824.

The term "machine readable medium" may include any medium capable of storing, encoding, or carrying instructions for execution by the machine 800 and that cause the machine 800 to perform any one or more of the techniques of the present disclosure, or capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 (e.g., software, programs, an operating system (OS), etc.) or other data are stored on the storage device 821, can be accessed by the memory 804 for use by the processor 802. The memory 804 (e.g., DRAM) is typically fast, but volatile, and thus a different type of storage than the storage device 821 (e.g., an SSD), which is suitable for long-term storage, including while in an "off" condition. The instructions 824 or data in use by a user or the machine 800 are typically loaded in the memory 804 for use by the processor 802. When the memory 804 is full, virtual space from the storage device 821 can be allocated to supplement the memory 804; however, because the storage 821 device is typically slower than the memory 804, and write speeds are typically at least twice as slow as read speeds, use of virtual memory can greatly reduce user experience due to storage device latency (in contrast to the memory 804, e.g., DRAM). Further, use of the storage device 821 for virtual memory can greatly reduce the usable lifespan of the storage device 821.

In contrast to virtual memory, virtual memory compression (e.g., the Linux® kernel feature "ZRAM") uses part of the memory as compressed block storage to avoid paging to the storage device 821. Paging takes place in the compressed block until it is necessary to write such data to the storage device 821. Virtual memory compression increases the usable size of memory 804, while reducing wear on the storage device 821.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 824 may further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 800, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

EXAMPLES

Example 1 is a NAND memory device comprising: a random-access memory (RAM) buffer; an array of NAND memory cells organized into pages, data stripes of user data, and a parity information area, wherein the parity information area includes parity information associated with the data stripes of user information; and a controller configured to: program first user data to a first portion of a first plurality of data stripes of the array of NAND memory cells; copying current parity information associated with a second plurality of data stripes from the RAM buffer to the parity information area; copying stored parity information of the first plurality of data stripes from the parity information area to the RAM buffer to replace the current parity information associated with the second plurality of data stripes; and determining new parity information for the first plurality of data stripes using the stored parity information and the first user data.

In Example 2, the subject matter of Example 1, wherein each data stripe of the plurality of first data stripes span multiple pages of the array of NAND memory cells.

In Example 3, the subject matter of Example 2, wherein each page of the multiple pages of the NAND memory of each data stripe is associated with a word line of the NAND memory device; and wherein, within a plane of the array of NAND memory, a page of a first data stripe is separated by each other page of the first data stripe by at least a plurality of word lines.

In Example 4, the subject matter of any of Examples 1-3, wherein a size of the parity information area is larger than the RAM buffer.

In Example 5, the subject matter of any of Examples 1-4, wherein the RAM buffer includes static RAM (SRAM).

Example 6 is a method comprising: programming a first number of data stripes of a NAND memory device with first data; loading a first number of parity information associated with the first number of data stripes from NAND memory of the NAND memory device to a random-access memory (RAM) buffer of the NAND memory device; refreshing the first number of parity information using the first data; programming a second number of data stripes of the NAND memory with second data; copying the first number of parity information to a parity information area of the NAND memory; loading a second number of parity information associated with the second number of data stripes from the parity information area to the RAM buffer to replace the first number of parity information; and refreshing the second number of parity information using the second data.

In Example 7, the subject matter of Example 6, each data stripe of the first number of data stripes span multiple pages of an array of NAND memory cells of the NAND memory device.

In Example 8, the subject matter of Example 7, wherein each page of the multiple pages of each data stripe is associated with a word line of the NAND memory device; and wherein, within a plane of the array of NAND memory, a page of a first data stripe is separated by each other page of the first data stripe by a plurality of word lines.

In Example 9, the subject matter of any of Examples 7-8, each data stripe of the second number of data stripes span the multiple pages of the array of NAND memory cells.

In Example 10, the subject matter of any of Examples 6-9, wherein a size of the RAM buffer is smaller than a combined size of the first number of parity information and the second number of parity information.

In Example 11, the subject matter of Example 10, wherein the size of the RAM buffer is smaller than parity information area of the NAND memory.

In Example 12, the subject matter of any of Examples 6-11, wherein the loading a first number of parity information associated with the first number of data stripes from NAND memory of the NAND memory device to a random-access memory (RAM) buffer of the NAND memory device includes loading a first number of parity information associated with the first number of data stripes from NAND memory of the NAND memory device to a static RAM (SRAM) buffer of the NAND memory device.

Example 13 is a method comprising: programming user data into multiple data stripes across multiple pages of NAND memory of a NAND memory device of a mobile electronic device; updating first parity information associated with a first plurality of data stripes of the multiple data stripes using a random-access memory (RAM) buffer of the memory device; and swapping the first parity information associated with the first plurality data stripes between a swap block location of the NAND memory and the RAM buffer.

In Example 14, the subject matter of Example 13 including filling the swap block location with parity information of the multiple data stripes.

In Example 15, the subject matter of Example 14, wherein the RAM buffer is sized to hold a fraction of the parity information held by the swap block location.

In Example 16, the subject matter of any of Examples 13-15, including: programming second user data into a second plurality of data stripes of the multiple data stripes across the multiple pages of the NAND memory of the NAND memory device of the mobile electronic device; and updating second parity information associated with the second plurality of data stripes using the RAM buffer.

In Example 17, the subject matter of Example 16, wherein updating second parity information includes: Retrieving second parity information from the swap block location of the NAND memory; Storing the second parity information in the RAM buffer; and executing a logical operation using the second parity information and the second user data to provide updated second parity information.

Example 18 is a machine-readable medium, comprising instructions, which when executed by a machine, cause the machine to perform operations comprising: programming user data into multiple data stripes across multiple pages of NAND memory of a NAND memory device of a mobile electronic device; updating first parity information associated with a first plurality of data stripes of the multiple data stripes using a random-access memory (RAM) buffer of the memory device; and swapping the first parity information associated with the first plurality data stripes between a swap block location of the NAND memory and the RAM buffer.

In Example 19, the subject matter of Example 18, wherein the operations further comprise: programming second user data into a second plurality of data stripes of the multiple data stripes across the multiple pages of the NAND memory of the NAND memory device of the mobile electronic device; and updating second parity information associated with the second plurality of data stripes using the RAM buffer.

In Example 20, the subject matter of Example 19, wherein updating second parity information includes: retrieving second parity information from the swap block location of the NAND memory; storing the second parity information in the RAM buffer; and executing a logical operation using the second parity information and the second user data to provide updated second parity information.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The invention claimed is:

1. A NAND memory device comprising:
a controller configured to perform operations comprising:
writing first data to a first data stripe, the first data stripe striped across multiple planes of an array of NAND memory cells;
calculating a first error correction (EC) value from the first data written to the first data stripe;
storing the first EC value in volatile memory;
writing second data to a second data stripe, the second data stripe striped across the multiple planes of the array of NAND memory cells;
copying the first EC value from the volatile memory to a defined block on the array of NAND memory cells;
copying a second EC value from the defined block to the volatile memory, the second EC value overwriting the first EC value, the second EC value having been previously written to the defined block and comprising an EC value previously calculated for previously written data written to the second data stripe prior to the second data; and
recalculating the second EC value based upon the second data written to the second data stripe.

2. The NAND memory device of claim 1, wherein the defined block is stored on a location on the array of NAND memory cells that comprise Single Level Cells.

3. The NAND memory device of claim 1, wherein the operations further comprise:
determining that programming of the second data stripe is complete; and
responsive to determining that the programming of the second data stripe is complete, writing the recalculated second EC value to a parity page in the array of NAND memory cells, the parity page a different portion of the array of NAND memory cells than the defined block.

4. The NAND memory device of claim 3, wherein the operations further comprise:
removing the second EC value from the volatile memory.

5. The NAND memory device of claim 1, wherein the first EC value is a parity value.

6. The NAND memory device of claim 5, wherein the operations of calculating the first EC value comprises performing an XOR operation on the first data written to the first data stripe.

7. The NAND memory device of claim 1, wherein the first data stripe is further striped across pagelines separated by a gap of at least one pageline, the pageline comprising two or more pages at a same position in each plane in a group of planes.

8. A method of writing data to a NAND memory device, the method comprising:
writing first data to a first data stripe, the first data stripe striped across multiple planes of an array of NAND memory cells;
calculating a first error correction (EC) value from the data written to the first data stripe;
storing the first EC value in volatile memory;
writing second data to a second data stripe, the second data stripe striped across the multiple planes of the array of NAND memory cells;
copying the first EC value from the volatile memory to a defined block on the array of NAND memory cells;
copying a second EC value from the defined block to the volatile memory, the second EC value overwriting the first EC value, the second EC value having been previously written to the defined block and comprising an EC value previously calculated for previously written data written to the second data stripe prior to the second data; and
recalculating the second EC value based upon the second data written to the second data stripe.

9. The method of claim 8, wherein the defined block is stored on a location on the array of NAND memory cells that comprise Single Level Cells.

10. The method of claim 8, wherein the operations further comprise:
determining that programming of the second data stripe is complete; and
responsive to determining that programming of the second data stripe is complete, writing the recalculated second EC value to a parity page in the array of NAND memory cells, the parity page a different portion of the array of NAND memory cells than the defined block.

11. The method of claim 10, wherein the operations further comprise:
removing the second EC value from the volatile memory.

12. The method of claim 8, wherein the first EC value is a parity value.

13. The method of claim 12, wherein the operations of calculating the first EC value comprises performing an XOR operation on the data written to the first data stripe.

14. The method of claim 8, wherein the first data stripe is further striped across pagelines separated by a gap of at least one pageline, the pageline comprising two or more pages at a same position in each plane in a group of planes.

15. A non-transitory machine-readable medium, storing instructions, which when executed by a controller of a NAND memory device, cause the controller to perform operations comprising:
writing first data to a first data stripe, the first data stripe striped across multiple planes of an array of NAND memory cells;
calculating a first error correction (EC) value from the first data written to the first data stripe;
storing the first EC value in volatile memory;
writing second data to a second data stripe, the second data stripe striped across the multiple planes of the array of NAND memory cells;
copying the first EC value from the volatile memory to a defined block on the array of NAND memory cells;
copying a second EC value from the defined block to the volatile memory, the second EC value overwriting the first EC value, the second EC value having been previously written to the defined block and comprising an EC value previously calculated for previously written data written to the second data stripe prior to the second data; and
recalculating the second EC value based upon the second data written to the second data stripe.

16. The non-transitory machine-readable medium of claim 15, wherein the defined block is stored on a location on the array of NAND memory cells that comprise Single Level Cells.

17. The non-transitory machine-readable medium of claim 15, wherein the operations further comprise:
- determining that programming of the second data stripe is complete; and
- responsive to determining that programming of the second data stripe is complete, writing the recalculated second EC value to a parity page in the array of NAND memory cells, the parity page a different portion of the array of NAND memory cells than the defined block.

18. The non-transitory machine-readable medium of claim 17, wherein the operations further comprise:
- removing the second EC value from the volatile memory.

19. The non-transitory machine-readable medium of claim 15, wherein the first EC value is a parity value.

20. The non-transitory machine-readable medium of claim 19, wherein the operations of calculating the first EC value comprises performing an XOR operation on the first data written to the first data stripe.

* * * * *